(12) United States Patent
Zucker et al.

(10) Patent No.: US 6,218,682 B1
(45) Date of Patent: Apr. 17, 2001

(54) OPTICALLY CONTROLLED THYRISTOR

(75) Inventors: Oved S. F. Zucker, Del Mar; David M. Giorgi, Solana Beach, both of CA (US)

(73) Assignee: OptiSwitch Technology Corporation, San Diego, CA (US)

( * ) Notice: Subject to any disclaimer, the term of this patent is extended or adjusted under 35 U.S.C. 154(b) by 0 days.

(21) Appl. No.: 09/156,458

(22) Filed: Sep. 18, 1998

(Under 37 CFR 1.47)

Related U.S. Application Data

(60) Provisional application No. 60/059,356, filed on Sep. 19, 1997.

(51) Int. Cl.⁷ ................................................ H01L 29/74
(52) U.S. Cl. ........................ 257/113; 257/686; 257/620
(58) Field of Search ........................... 257/113, 115–118, 257/137, 154, 164, 444, 620, 432, 436, 686

(56) References Cited

U.S. PATENT DOCUMENTS

| | | | |
|---|---|---|---|
| 4,186,409 | * | 1/1980 | McMullin ............................ 257/117 |
| 4,219,833 | * | 8/1980 | Temple ................................ 257/115 |
| 4,497,109 | * | 2/1985 | Huber et al. ........................ 438/133 |
| 4,572,947 | * | 2/1986 | Kao et al. ........................... 257/118 |
| 4,866,500 | * | 9/1989 | Nishizawa et al. ................. 257/114 |
| 4,908,687 | * | 3/1990 | Temple ................................ 257/115 |
| 5,017,991 | * | 5/1991 | Nishizawa et al. ................. 257/114 |
| 5,747,835 | * | 5/1998 | Pezzani et al. ..................... 257/113 |

FOREIGN PATENT DOCUMENTS

| | | | |
|---|---|---|---|
| 27 38 160 | * | 3/1979 | (DE) ................................... 257/113 |
| 53-112682 | * | 10/1978 | (JP) ................................... 257/118 |
| 56-152266 | * | 11/1981 | (JP) ................................... 257/115 |
| 57-196567 | * | 12/1982 | (JP) ................................... 257/113 |
| 7-15004 | * | 1/1995 | (JP) . |

OTHER PUBLICATIONS

Alferov, Zh. I. et al., "Electrically controllable three–electrode high–voltage subnanosecond switches made from a multilayer GaAs–AlGaAs heterostructure", *Sov. Tech. Phys. Lett.* 12(11):529–530 (Nov. 1986).

Carson, R.F. et al, "Long switching delay mechanisms for optically triggered GaAs thyristors", *Appl. Phys. Lett.* 59(7):834–836 (Aug. 12, 1991).

Electric Power Research Institute, Palo Alto, California, "Proceedings: Light–Fired Thyristor Workshop", WS–77–049 Workshop Proceedings, (Mar. 1978).

(List continued on next page.)

*Primary Examiner*—Olik Chaudhuri
*Assistant Examiner*—Nathan W. Ha
(74) *Attorney, Agent, or Firm*—Altera Law Group, L

(57) ABSTRACT

In an optically controlled thyristor having a four layer thyristor structure with respective first, second, third and fourth layers, the first and third layers have a first doping type, and the second and fourth layers have a second doping type different from the first doping type. A first shorting structure, formed from a semiconductor material of opposite doping from the first layer, is electrically coupled to the second layer by an electrically conducting, optically opaque layer. A first conductive layer connects between the first layer and the shorting structure and is adapted to transmit light into the first shorting structure. The first semiconductor layer of an optically controlled thyristor may have an aperture therethrough to permit light to enter the second layer from a first conductive layer side without propagating within the first layer. The semiconductor switch may be incorporated into a switching system having a light source controlled by a controller, and having a optical transmission channel coupled between the thyristor switch and the light source.

32 Claims, 6 Drawing Sheets

OTHER PUBLICATIONS

Long, J. et al., "New Experiments With Light Activated Silicon Switches", *Lawrence Livermore Laboratory*, Preprint UCRL—80492, (Dec. 27, 1977).

Page, D., "Some Advances in High Power, High dI/dt, Semiconductor Switches", *Energy Storage, Compression, and Switching*, pp. 415–421 (1976).

Zhao, J. et al., "Dynamic I–V Characteristics of an AlGaAs/GaAs–Based Optothyristor for Pulsed Power–Switching Applications", *IEEE Electron Device Letters* 13(3):161–163 Mar. 1992).

Zhao, J. et al., "Using Reverse Dynamic I–V Characteristics of AlGaAs/GaAs Optothyristor For Pulsed Power–Switching Applications", *Electronics Letters* 28(11):977–978 (May 21, 1992).

Zucker, O. et a., "Experimental demonstration of high–power fast–rise–time switching in silicon junction semiconductors", *Applied Physics Letters* 29(4):261–263 (Aug. 15, 1976).

* cited by examiner

OPTICALLY CONTROLLED THYRISTOR

This application claims priority from provisional application Ser. No. 60/059,356, filed Sep. 19, 1997, and which is incorporated herein by reference.

BACKGROUND

The present invention is directed generally to a high power semiconductor switch, and particularly to an optically controlled thyristor having optical control.

The need for improved electrical grid power quality and greater utility power control resulted in the implementation of various semiconductor-based electrical control systems such as circuit breakers, volt-ampere reactive (VAR) compensators, and sub-synchronous resonance (SSR) dampers.

The thyristor is a well known power semiconductor switch that permits large currents to be switched at high voltages. The thyristor has four semiconducting layers. Typically, the two outer layers are heavily doped extrinsic layers, while the inner two are lightly doped. Adjacent layers are oppositely doped from their neighbors, forming a number of semiconductor junctions therebetween.

The thyristor is turned on when carriers enter one of the inner layers. Typically, this is performed by injecting a small gate current pulse into one of the inner layers. Where the gate current is injected over only a portion of the inner layer, the current through the thyristor does not reach a maximum value until the entire layer is conducting. The time taken for the current to spread laterally to fill the layer is limited by the lateral carrier diffusion velocity. The device only reaches full current capacity after the carriers have diffused sufficiently to uniformly saturate the device. One approach to reducing the turn on time is to inject the gate current over a large area of the thyristor, which necessitates a high degree of interdigitization between the gate electrode and the cathode electrode. An increased gate electrode results in less active area on the wafer for carrying the high power current.

Another method of turning on a thyristor is to overvolt the device, thus creating carriers by avalanche breakdown in the vicinity of the reverse-biased central junction between the two inner layers. However, this method is less controllable than gate current injection and creates damage regions in the device, thus reducing its useful lifetime.

A third method for turning on a thyristor is to create charge carriers in the center junction through the absorption of light. Past attempts at light activation of a thyristor have included illuminating a portion of the thyristor with light transmitted from the end of a fiber. This resulted in the turn-on time of the thyristor again being limited by lateral diffusion velocity.

The basic thyristor is limited to being actively switched only to the on state, and cannot be actively switched to the off state. Unlike the gate of a transistor, the gate of the thyristor loses active control once the device starts to conduct, and the thyristor switches off only when the current falls below a certain holding current value for a certain minimum time. This inability to be actively turned off limits the use of the thyristor in many applications.

There have been several attempts to make a power semiconductor switch having active on/off switching capabilities. Ideally, semiconductor switches providing active on/off capabilities should have the following characteristics: 1) their power handling capacity should approach that of the thyristor, while maintaining the relatively high speed of metal-oxide semiconductor field effect transistors (MOSFETs); 2) they should have the ability to match the device impedance to the particular application, and thus voltage and current choices should span a broad range without sacrificing other performance parameters; and 3) they should have trigger isolation for series stacking.

There are three existing bipolar semiconductor switches, namely the gate turn-off thyristor (GTO), the insulated gate bipolar transistor (IGBT) and the metal oxide semiconductor (MOS) controlled thyristor (MCT), that are used for on/off switches. All three fall short of the requirements described in the previous paragraph due to their inherent limitations.

The GTO has turn-off capability by externally diverting the emitter current to the gate, thus requiring a large gate area that competes with the emitter area for current-carrying capacity on the wafer. A reduced emitter area results in a reduced current carrying capacity. In addition, there is a large current tail associated with the turn-off. The current pinching substantially reduces the turn-off current relative to the maximum on current. Also, the large gate current of the GTO requires substantial external circuitry.

The IGBT uses a MOSFET to provide a short in the Darlington fashion to supply the base current. The power transmitted by the IGBT is principally limited by the fact that MOSFETs are more limited in their current carrying capability in comparison to bipolar devices. Thus, to accommodate a larger collector current with a small MOSFET current requires a large current gain. To achieve a large gain requires a narrow base region, which increases the emitter injection efficiency. However, the narrow base results in a lower voltage, thereby resulting in a lower power device.

The MCT is a thyristor-based structure that uses MOSFETs to provide electrical shorts for both turn-on and turn-off operations. In turn-off, the current is limited by the MOSFET, which has to fully short one of the injecting diodes of the thyristor structure. Turn-on also is affected by shorting MOSFETs, which necessitates bringing the deep n-drift region of the thyristor structure to the outside surface, thus resulting in a loss of real estate on the wafer which could otherwise be used for actively carrying current. Consequently, the MCT typically falls short of carrying the power levels of the thyristor, the GTO, and the IGBT.

Lastly, the use of MOSFETs to create emitter shorts in the MCT for turn-off requires the MOSFET to compete with the bipolar device in current carrying capability, since the entire bipolar device current is shunted into the MOSFET. If the MOSFET was capable of carrying the full current carried by the bipolar device, there would not be a need for the bipolar device in the first place. The fundamental concept of the MCT is that when the elemental device is shrunk sufficiently, the reduced bipolar current can be carried by the MOSFET during the opening process. Consequently, the current carrying capability is reduced because of the large area allocation for the MOSFET structure. Additionally, there is increased expense resulting from the finer structure design.

To summarize, existing on/off semiconductor power devices fall short in both on-activation and off-activation. Present methods of on-activation demand a compromise between current carrying capacity and device turn on time. Present methods of off-activation are limited due to either the use of MOSFETs to provide shorts (MCT), or due to the limited current and associated speed that can be effectively diverted with external circuits (GTO).

Therefore, there exists a need for an improved semiconductor power switch having on/off control, and whose power handling capabilities in terms of switch response time and total current carrying capacity are increased.

SUMMARY OF THE INVENTION

Generally, the present invention relates to a high power semiconductor switch having on/off control.

One particular embodiment of the invention is an optically activatable semiconductor switch that includes a four layer thyristor structure, having respective first, second, third and fourth layers, the first and third layers having a first doping type, and the second and fourth layers having a second doping type different from the first doping type. A first shorting structure, formed from a semiconductor material of opposite doping from the first layer, is electrically coupled to the second layer by an electrically conducting, optically opaque layer. A first conductive layer connects between the first layer and the shorting structure and is adapted to transmit light into the first shorting structure.

This semiconductor switch may be incorporated into a switching system having a light source controlled by a controller, and having a optical transmission channel coupled between the thyristor switch and the light source.

In another embodiment of the invention, a method of controlling a thyristor includes illuminating a shorting structure, maintained at a same potential as a thyristor emitter layer and electrically connected to a thyristor base layer, with light absorbed by the shorting structure, so as to generate a shorting current between the thyristor emitter layer and the thyristor base layer.

Another embodiment of the switch includes a four layer thyristor structure, having respective first, second, third and fourth semiconductor layers, the first and third layers having a first doping type, and the second and fourth layers having a second doping type different from the first doping type. A first conductive layer overlies the first semiconductor layer and is adapted to transmit light into the semiconductor layers. The first semiconductor layer has an aperture therethrough to permit light to enter the second layer from a first conductive layer side without propagating within the first layer.

This semiconductor switch may be incorporated into a switching system having a light source controlled by a controller, and having a optical transmission channel coupled between the thyristor switch and the light source.

Another embodiment of the invention is a method of controlling a thyristor having first, second, third and fourth consecutive semiconducting layers. The method includes illuminating a portion of at least one of the second and third layers of the thyristor exposed for illumination through an aperture in the first layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
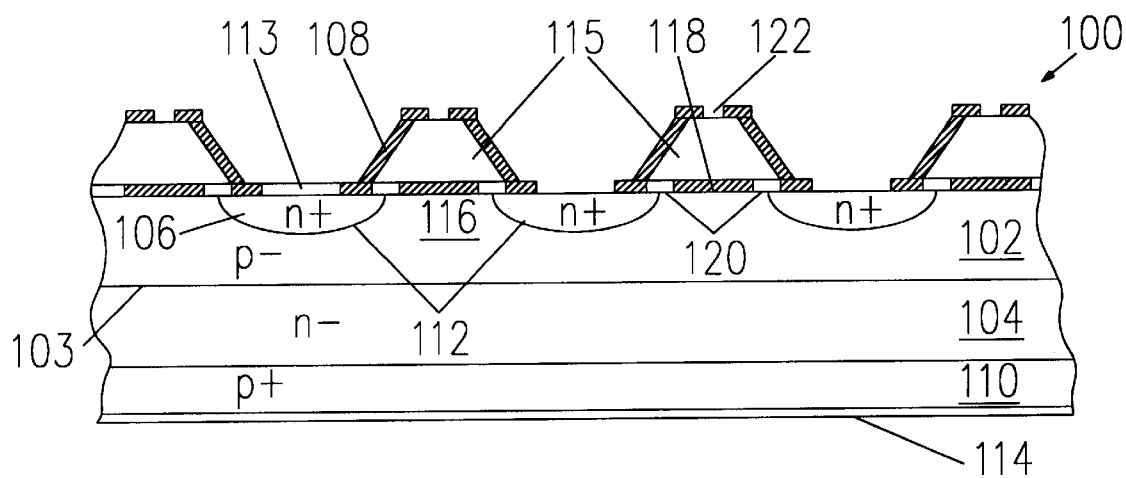
FIGS. 1A and 1B illustrate cross-sectional views through two different embodiments of light controlled thyristor according to the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention relates to a high power semiconductor switch having on/off control, and more particularly to a thyristor-based device having optical activation for both on and off functions.

Semiconductor switches need to satisfy many different application-specific requirements. Some requirements fit the specialty category such as a large rate of rise of current (dI/dt) for switches having only active-on capabilities, for example in circuit breaker applications. However, a broader range of requirements involve active-on and active-off (active on/off) switches. Ideally, active-on/off power semiconductor switches should have power carrying capabilities that approach those of the thyristor while maintaining the speed of the MOSFET. They should also have trigger isolation for series stacking. Furthermore, power semiconductor switches must be price competitive. The benefits of improved active semiconductor switching technology are more speed, more precise control and better utilization of the utility grid, as well as smaller and cheaper attendant energy storage components and transformers. Improved power semiconductor switching devices also bring benefits to other areas, including such as motor control, switching power supply, radar modulators and related power systems.

The semiconductor devices described here are based on the use of optical triggering to actively switch on and/or off, and are referred to by the generic name "light controlled thyristors" (LCTs). Optical activation involves illuminating the semiconductor device with light. The light is absorbed within the semiconductor producing electron-hole pairs at the site of absorption. Thus, optical activation permits the generation of carrier pairs within the device, and does not require the injection of carriers. Hence, where the illuminating light pulse is short, optical activation can create carriers within the device considerably faster than injection, which is limited in speed by the carrier drift velocity. Optical activation can be used for switching semiconductor devices on by creating a population of carriers, for example, within a junction.

Judicious selection of the wavelength of the activating light results in the ability to control the absorption depth, and hence the volume of semiconductor material activated by the optical pulse. This permits the fraction of wafer real estate devoted to activation to be reduced relative to that required for gate current activation, and hence the fraction of wafer real estate used for carrying the high power current is increased. In addition, uniform illumination of the device presents the possibility of combining fast turn-on times with large current carrying capacity.

Another interesting possibility is the ability to actively turn a device off with using light. The basic principle for active turn-off is to create an electrical short across the injecting forward biased junctions with light. Light makes a superior electrical short, compared to a short created by MOSFET, since the amount of light can be controlled to produce virtually any practical carrier concentration within in any selected shorting region. The overall result is that active light-controlled on and off, with the added benefit of trigger isolation, can be realized. Thus, the use of an LCT enables a new generation of active on/off switches having superior power handling.

One particular embodiment, having an interdigitized electrode to permit uniform light activation of the invention is illustrated in FIG. 1A. The thyristor 100 has a p-type base layer 102 and an n-type drift layer 104, forming the main blocking junction 103 therebetween. The n-type emitter layer 106, composed in this particular embodiment of regions 112, or islands, of n+ doped material, forms a junction with the other side of the p-type base layer 102 and is connected to the cathode electrode 108, typically a metallic layer deposited on the n+ emitter layer 106. The p+ anode layer 110 lies below the n-drift layer 104. The p+ anode layer 110 is overcoated with an electrode 114 to form the anode. There are apertures 113 in the cathode electrode 108 to receive light for activating the thyristor 100 to the on-state. The cathode electrode 108 and anode electrode 114 may be formed from nickel/gold, tin/nickel/gold, aluminum, or other suitable metal used for electrodes on semiconductor devices.

The p-base layer 102 and the n-drift layer 104 form a blocking junction 103 between each other. This blocking junction 103 is usually reverse-biased when the thyristor 100 holds off a high voltage. The n+ emitter regions 112 form diode junctions, commonly called an injection diodes or base-emitter junctions, with the p-base layer 102. Likewise, the p+ anode layer 110 forms a diode junction (injection diode) with the n-drift layer 104. It will be appreciated that the presence of n-p and p-n junctions enables the device to hold off an applied voltage of either polarity.

A p-type shorting region 115 overlies the intervening portion 116 of the p-base layer 102 between adjacent n+ emitter regions 112. The shorting region 115 is separated from the intervening portion 116 of the p-base layer 102 by an electrically conducting layer 118. The electrically conducting layer 118 may be a metal film, such as aluminum, or the like generally used for forming electrodes on semiconductor devices. A layer of insulating material 120 lies between the shorting region 115 and n+ emitter region 112. The layer of insulating material 120 insulates the electrically conducting layer 118 from the emitter region 112 and from the cathode electrode 108. The insulating material 120 may be, for example, silicon nitride or other suitable material such as an amorphous material. Both the electrically conducting layer 118 and the layer of insulating material 120 are optically opaque to the activating light, thus optically isolating the shorting region 115 from the rest of the device. Thus, light does not pass from the rest of the device into the shorting region 115, nor from the shorting region 115 into the rest of the device.

The shorting region 115 is overcoated with the cathode electrode 108. That portion of the cathode electrode 108 overlying the shorting region 115 may be provided with access apertures 122 to permit activating light to illuminate the shorting region 115 for turning the thyristor 100 off. The activating light may be introduced into the thyristor 100 through the apertures 113 and 122 a number of different ways. The light may simply propagate towards and through the apertures 113 and 122, or may be introduced by an optical fiber. The optical fiber may illuminate the apertures 113 and 122 by light passing out of the fiber end, or by light passing out of the side of the fiber.

The cathode electrode 108 may be adapted to transmit the activating light into the thyristor 100 in a number of other ways, in addition to having an aperture. For example, the thickness of the metalization may be reduced at certain regions to permit light to pass through, while still maintaining electrical conductivity over those regions.

Before describing how the LCT operates, it is useful first to consider turn-on in a conventional thyristor. The turn-on process in a conventional four-layer device requires the carrier concentration at the blocking junction to approach saturation. This is typically achieved by applying a gate current pulse to the p-base layer to produce the injection of electrons from the n+ emitter layer into the p-base layer. The conventional turn-on process proceeds in two stages. First, the injection of carriers into the blocking junction region collapses the voltage by turning the device on in a small fraction of the device area. The thyristor may be viewed as a pair of interleaved transistors. Injection of carriers into the blocking junction results in turning on the first transistor of the transistor pair, and thus the second transistor latches on in the thyristor fashion. Subsequently, the device turns on through lateral carrier diffusion, which is a slow process, in the region of 50 $\mu m/\mu s$.

The greater the interdigitization of the gate electrode in the conventional device, the shorter the distance required for lateral diffusion and so the device turns on faster, i.e. it has a higher dI/dt. The competition for surface area between the emitter and the gate trades off speed against current capability, and thus power, in both the IGBT and the MCT. The Darlington configuration in the MCT necessitates the access to the n-drift layer 104 as the base of one of the interleaved transistors of the thyristor pair, which further reduces the available emitter area. In addition, the access to the collector compromises the planar configuration, which is best for voltage holding. Thus, the reduced voltage and a reduced current result in further lowering the power.

In the LCT, an optical pulse is transmitted, typically via a switch-on fiber, to initially create a dense electron and hole plasma throughout the device. The activating light may be transmitted through the aperture 113, or may be introduced through the aperture 113 by a waveguide, such as an optical fiber. Illumination of the thyristor for turn-on is described in detail below.

The active turn-on process using optical activation is fundamentally different because the creation of carriers in situ does not need to rely on meaningful lateral carrier diffusion. The depletion layer to be collapsed in the turn-on process is supported by a background doping which typically in the range $10^{12}$–$10^{13}$ cm$^{-3}$. The concentration of optically generated carriers is typically four to six factors of 10 higher in magnitude. Thus, as soon as the carrier concentration is established within the device through light absorption, a small rearrangement of the generated carriers cancels the field across the depletion region. This process may take place in a time frame of less than a nanosecond and, therefore, the voltage collapse may be regarded as occurring at the same rate at which light is supplied to the device.

The depth to which the activating light penetrates the thyristor 100 may be adjusted by controlling the frequency of the activating light. The semiconductor material typically has a sharp absorption band edge, and adjustment of the frequency of the activating light relative to the band edge results in a change in the absorption depth. One example of a light source suitable for activating silicon devices is a Nd³⁺solid state laser. The Nd:YAG laser has a laser line at a wavelength of approximately 1.06 μm, which corresponds to an absorption depth in silicon of about 1 mm. Therefore, the separation between fibers that illuminate the device for turn-on may be around 2 mm, which is a distance considerably greater than the typical interdigitization distance for electrodes on conventional devices. Thus, more real estate may be left on the wafer for the main current carrying electrodes, and the current carrying capacity of the entire device is greater. Other types of laser that may be used in activating the LCT are described below. Fine control of the absorption depth may also be achieved by temperature controlling the semiconductor device.

Advantages provided by using optical activation are that the current risetime, dI/dt, is higher than with conventional switches, the planar geometry is maintained to withstand high applied voltages, and more real estate on the wafer can be preserved for carrying high power current.

Next we consider turn-off processes, first in conventional devices. Present devices use emitter shorts in two ways. In the first way, the shorting of the MCT's injection diode by a MOSFET initiates the opening of the MCT. As was discussed previously, the MOSFET has to carry the full device current to stop injection completely. This is something the MOSFET does not do well, because it is a majority carrier device with a relatively high on-resistance.

In the second way, fixed resistive emitter shorts are used to reduce the gain during the off state to prevent turn on by a sharp rise in voltage, i.e. conditions where dV/dt is high. The emitter short is a fixed resistor connected between the electrode and the base layer in parallel with the emitter layer. The voltage drop across such a short depends on the current flowing through the device. The fixed emitter short represents a compromised solution since ideally the resistance should be low in the off state, i.e. the voltage across the injection junction should be insensitive to dV/dt turn-on, and high in the on state for high injection efficiency.

In the LCT 100, the shorting region 115 is available to create an electrical short between the cathode electrode 108 and the p-base layer 102, to bypass the emitter regions 112. The shorting region 115 has a high intrinsic resistivity, and its carrier concentration can be altered by changing the level of optical illumination through the gaps 122 in the cathode, so as to modulate the resistivity of the shorting region 115 over a wide range. Under ideal conditions, the resistivity of the shorting region 115 may be controlled to be a complete short, a complete open or any other value in between.

In the device 100, the shorting region 115 connects the n+ emitter regions 112 to the p-base layer 102 through the conducting layer 118. The conducting layer 118 prevents photon-generated electrons from crossing into the p-base layer 102, which may keep the junction injecting. The conducting layer 118 and the opaque insulating layer 120 prevent the off-switching light from reaching the p-base layer 102 or the emitter regions 112. The insulating layer 120 prevents a direct short from the conducting layer 118 to the cathode electrode 108 or to the emitter regions 112.

In operation, an optical pulse is transmitted through the shorting region electrode aperture 122, either directly or via a waveguide, such as an optical fiber, to create carrier pairs in the shorting region 115. When the shorting region 115 has a high carrier concentration, there is an electrical short across the top injecting diodes formed by the n+ emitter regions 112 and the p-base layer 102. This terminates self-injection into the base junction 103 and the thyristor 100 turns off. Thus, a more complete shorting of the injecting junction is possible without the loss of cathode area or compromising the inherent voltage holding of the device.

As mentioned previously, the resistivity of the shorting region 115 may be controlled continuously from an open to a short by adjusting the level of illumination absorbed within the shorting region 115. Therefore, a low illumination level may be used to increase the conductivity of the region while the thyristor 100 is off, thus protecting it from high dV/dt pulses, and preventing the device from turning on unintentionally.

Where the shorting region 115 is illuminated to prevent high dV/dt turn-on, the low level illuminating light may be turned off and the resistivity of the shorting region 115 allowed to revert to a high value after a few recombination times. Thus, the resistivity of the shorting region 115 is high when the thyristor 100 is turned on, so as to maintain the on-state voltage drop across the top injection junctions formed by the n+ emitter regions 112 and the p-base layer 102. Maintenance of the on-state voltage drop results in high injection efficiency of electrons from the emitter regions 112 into the p-base layer 102.

To summarize the operation of the shorting region 115, the resistivity of the shorting region 115 is modulated by low level optical illumination so that an emitter short is created in the off-state to increase the dV/dt limit. The illumination of the shorting region 115 is terminated to allow its resistivity to recover to a high value. Next, a high level illumination pulse is used to saturate the main body of the thyristor for fast turn-on. To turn the thyristor 100 off once it is activated, the shorting region 115 is optically illuminated to create an electrical short across the injecting junction, thus terminating self-injection within the thyristor and affecting fast turn-off. Once the thyristor 100 has turned off, the low illumination level of the shorting region 115 may be resumed to increase the dV/dt hold-off capability.

Figure 1B:
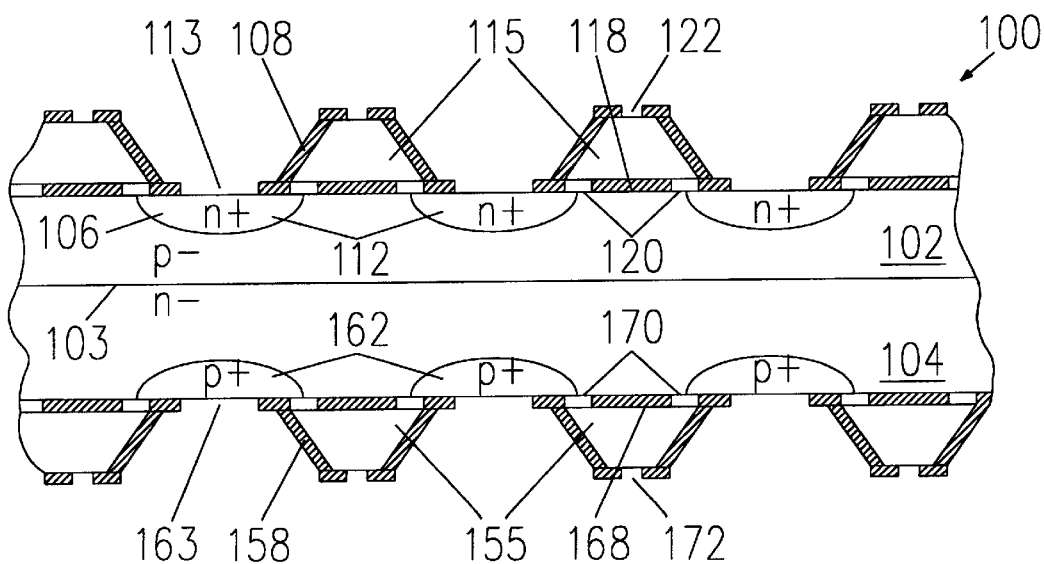

In another embodiment, illustrated in FIG. 1B, a shorting region can be applied to the opposing junction of the thyristor structure, thus providing two fully shorted injection junctions to initiate faster turn-off, and provide increased protection against dV/dt turn-on. The basic structure is essentially the same as that illustrated in FIG. 1A, with some modification. Like elements in FIGS. 1A and 1B have been given the same label. Additional shorting regions 155 (n-type) are provided on the lower surface of the device 150, that are electrically connected to the n-drift layer 104 by the electrically conducting, optically opaque layers 168. Optically opaque, insulating layers 170 are positioned between the shorting regions 155 and the n-drift layer 104. The insulating layers 170 prevent light from passing between the shorting regions 155 and the rest of the thyristor structure, and electrically insulate the opaque, electrically conducting layers 168 from the p+ anode regions 162 and the anode metalization layer 158. The anode metalization layer 158 covers both the p+ anode regions 162 and the shorting regions 155. Gaps 163 are provided in the anode metalization layer 168 to permit activation light to enter the thyristor 100 for switch on, and other gaps 172 are provided over the shorting region 155 to give optical access for optically switching the shorting region 155.

Figure 2A:
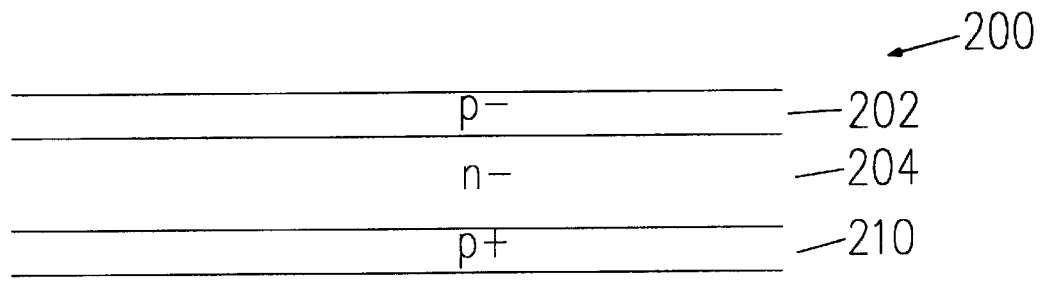
FIGS. 2A–2F illustrate fabrication steps for the light controlled thyristor illustrated in FIG. 1A.

Various steps in the process for fabricating an LCT are illustrated in FIGS. 2A–2F. An n-type silicon wafer 200 has a p–region 202 diffused on one side and a p+ region 210 diffused on the other side, leaving an n– region 204 lying between the two p-type regions 202 and 210, as illustrated in FIG. 2A.

Figure 2B:
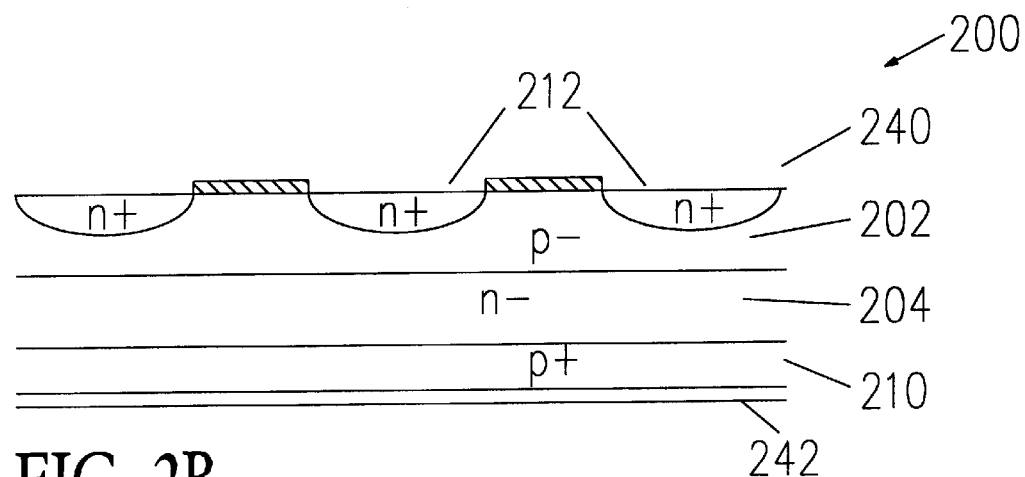
Figure 2C:
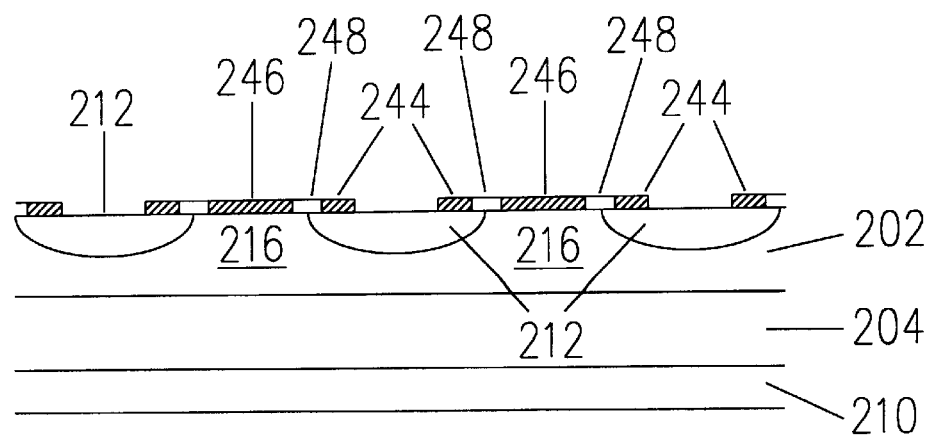

The p-doped regions 202 and 210 are masked with photoresist layers 240 and 242. The photoresist layer 240 overlying the p– region 202 is patterned, exposed, and developed to expose areas of the p– region 202. Emitter n+ regions 212 are formed by doping the exposed areas of the p– region 202, as shown in FIG. 2B.

The photoresist layer 240 is then removed. Another photoresist mask, a metalization mask, is applied over the upper surface of the substrate 200, by exposing and developing the photoresist layer. Portions of metalization 244 are deposited over the emitter regions 212 and other portions of metalization 246 are laid over those portions 216 of the p– layer 202 lying between the emitter regions 212. The metalization mask is then removed and an insulator mask is applied over the surface of the substrate, exposing the areas between the metalization portions 244 and 246. A layer 248 of an insulating, optically opaque material is deposited between the metalization portions 244 and 246, to produce the structure illustrated in FIG. 2C.

Figure 2D:
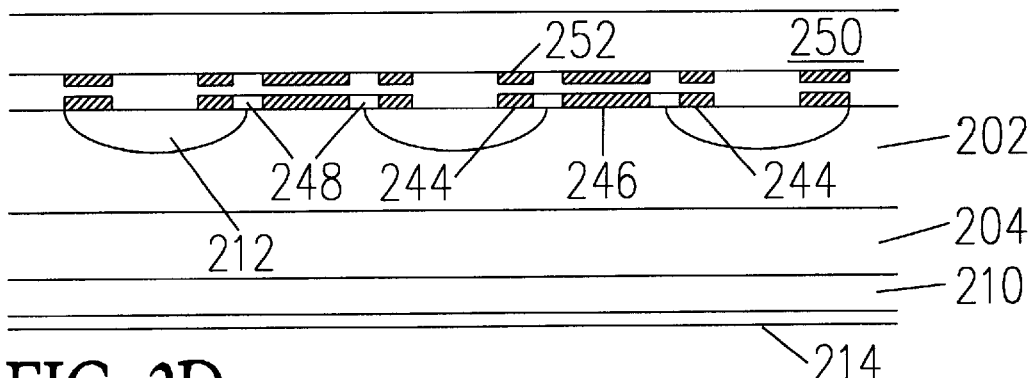
Figure 2E:
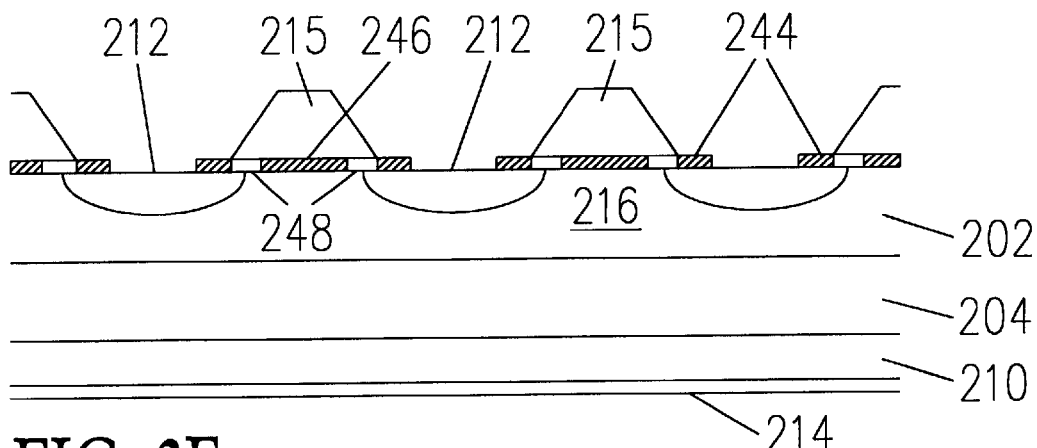

A shorting wafer 250 is prepared by diffusion of p+ dopants into a low-doped p substrate. The lower surface of the shorting wafer 250 is provided with a metalization pattern 252 that corresponds to the pattern of metalization portions 244 and 246 on the wafer 200, as illustrated in FIG. 2D. The metalization pattern 252 on the shorting wafer 250 may be formed by metalizing through a suitably patterned mask.

A metalization layer 214 is deposited over the p+ layer 210.

The shorting wafer 250 is bonded to the wafer 200 through metal to metal bonding. Portions of the shorting wafer 250 that overlie the cathode regions 212 of the wafer 200, and that are not bonded, are removed, for example by etching or grinding. The removal of these portions of the shorting wafer result in the exposure of the unbonded portions of the emitter regions 212, and the creation of shorting regions 215 above the regions 216 of the p– layer 202 that lie between the emitter regions 212. The structure is illustrated FIG. 2E.

Figure 2F:
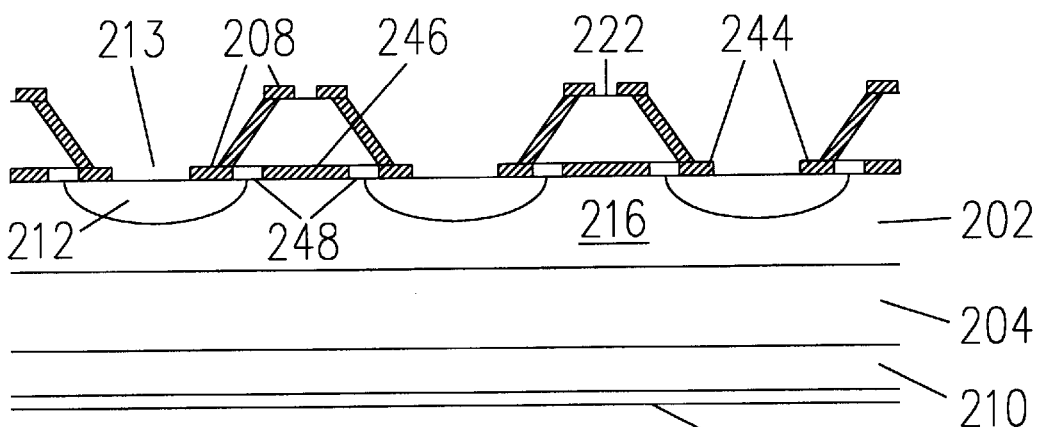

After the formation of a suitable mask over the resulting structure, a metalization layer is deposited over the top surface to produce a cathode electrode 208. The cathode electrode 208 has illumination gaps 213 above the n+ regions 212 and shorting gaps 222 above the shorting regions 215, to permit illumination of the different semiconductor regions for light activation, as shown in FIG. 2F.

Prior to formation of the cathode electrode 208, grooves may be cut in the wafer 200 to receive fiber optics for illuminating the device, in a manner like that described below with reference to FIGS. 5A and 5B.

Figure 3:
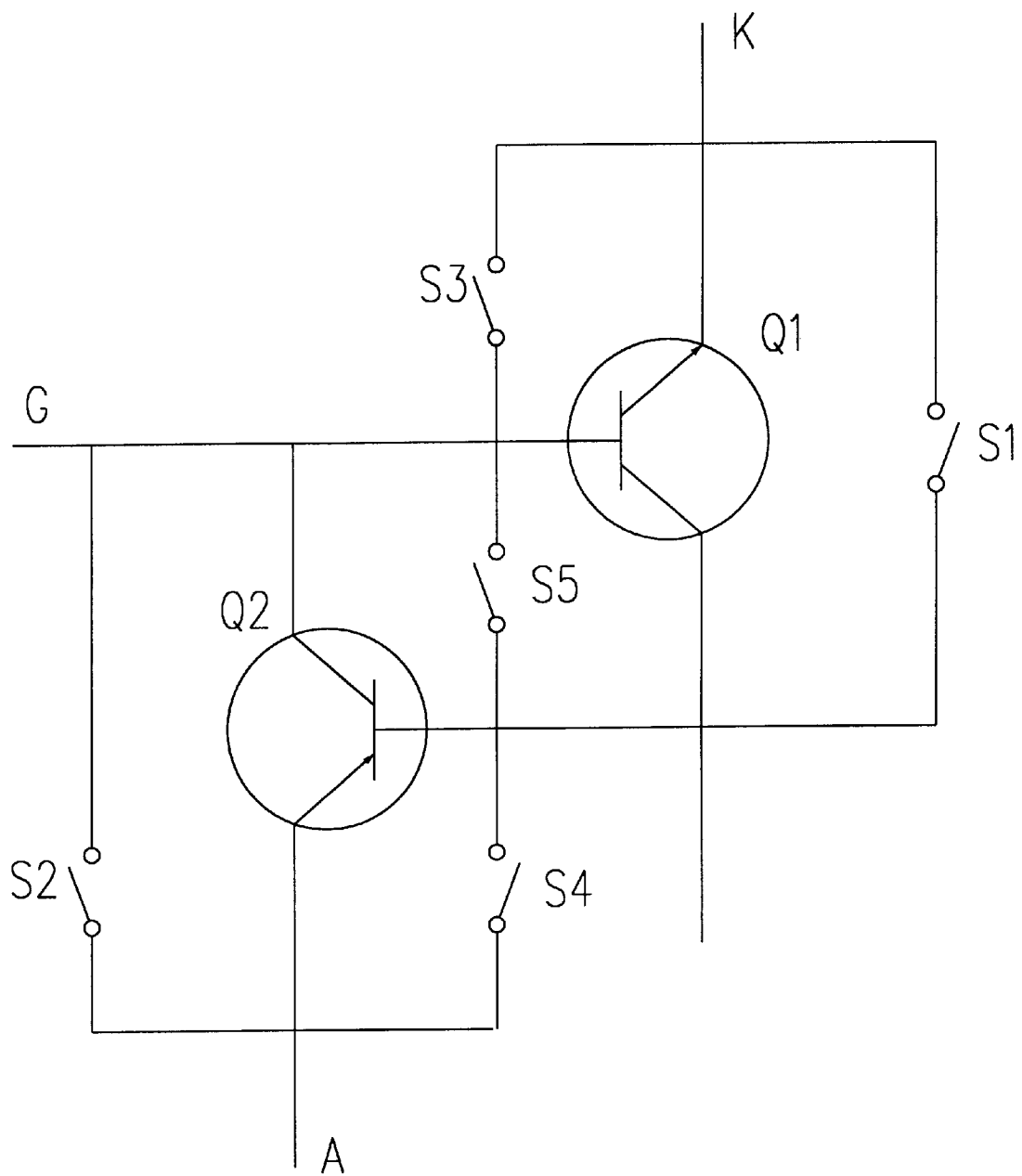
FIG. 3 illustrates an equivalent circuit for the light controlled thyristor.

An equivalent circuit to the four-layer device illustrated in FIGS. 1A and 1B is illustrated in FIG. 3. The four layers of the thyristor may be viewed as two interlaced transistors, an n-p-n transistor Q1 and a p-n-p transistor Q2. The p-base and the n-drift layers may be viewed as the bases of the p-n-p and the n-p-n transistors, respectively.

In conventional devices, the closure of switches S1 and S2, for example by MOSFETs, initiates self-injection of the base junction of the thyristor, thus switching the thyristor on. However, in the LCT, carriers are created throughout the device by photoabsorption, effectively closing switch S5 between the n-p-n and p-n-p transistors. This is possible only with light activation which instantaneously creates carriers in the blocking base junction and obviates the need for carrier transport by diffusion and drift.

The shorting regions of the LCT arc shown as shorting switches S3 and S4. Optical activation of these regions creates a short across the injecting junction, so that the voltage drop across the injecting junction is sufficiently low as to stop injection from the n+ and p+ regions.

A conventional MOSFET has difficulty in shunting and thus carrying the bipolar current. This drives the IGBT and MCT feature size down to the micron level. In contrast, the higher carrier concentration achievable with optical activation allows a faster, higher conductivity short than is possible using a MOSFET.

Figure 4A:
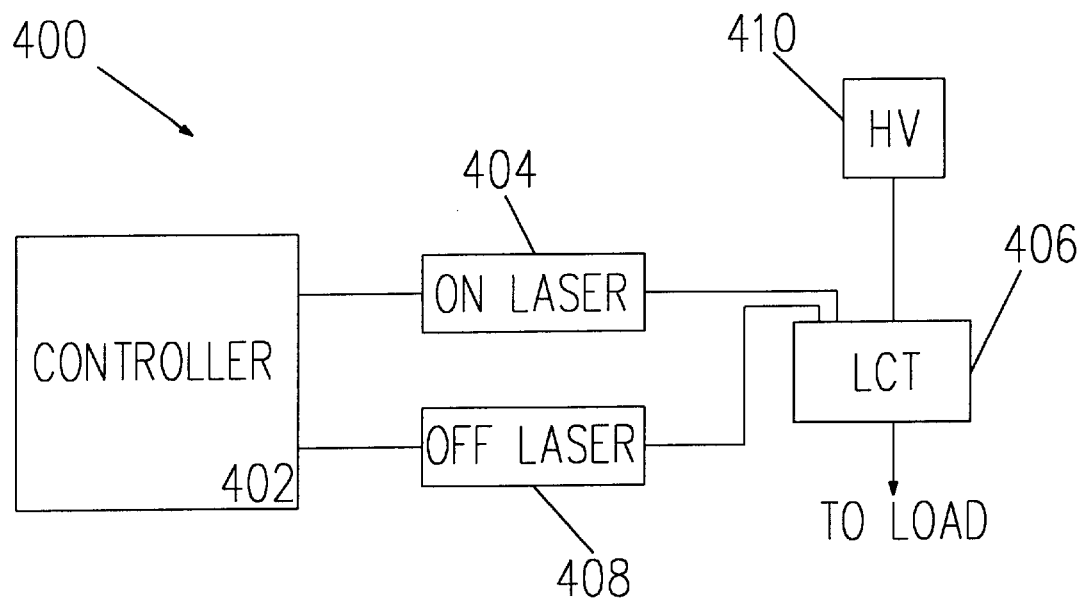
FIGS. 4A and 4B show schematic diagrams of electrical switch systems based on light controlled thyristors.

A switching system 400 using an LCT is illustrated in FIG. 4A. This switching system is based on the use of light to affect the transitions from off to on and on to off, while the on state itself is maintained in the standard thyristor manner through self injection. A controller 402 generates appropriately timed trigger signals for controlling a first laser 404 to direct light to the LCT 406 for switching on, and a second 408 laser for directing light to the shorting regions of the LCT 406 for switching off and for providing dV/dt event protection. The LCT 406 is connected to switch power from a high voltage supply 410 to a load.

Figure 4B:
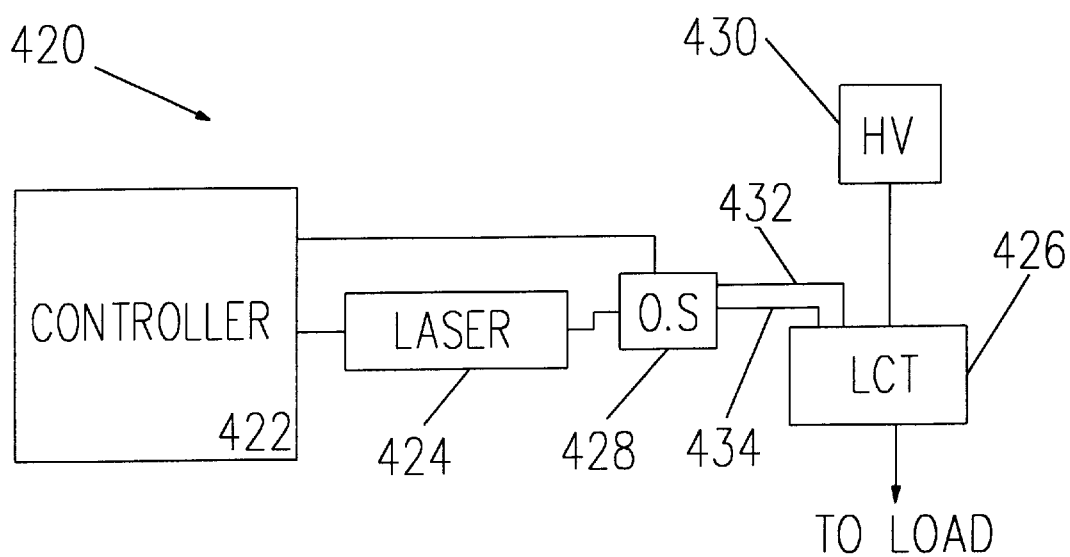

Another embodiment of a switching system 420 is illustrated in FIG. 4B. In this second embodiment 420, a single laser 424 is controlled by the controller 422. The output light from the laser is directed through an optical switch 428. The optical switch is controlled by the controller 422 to switch the incoming light received from the laser 424 between one of two output paths. The first output path 432 directs light to the LCT 426 for switching on. The second output path 434 directs light to the shorting regions of the LCT 426 for switching off and for providing dV/dt event protection. The LCT 426 is connected to switch power from the high voltage source 430 to the load.

It has been shown that the average illumination energy density required to switch the LCT to the on-state is around 10 $\mu J/cm^2$. Therefore, for an LCT operating 100 Hz and having a wafer with an area of around 100 $cm^2$, the required average optical power is approximately 0.1 W of average laser power. Likewise, the illuminating energy density requirement for the off-switching light can be shown to be a function of the interdigitization (proportional to $\delta^2$ where $\delta$ is the critical dimension of the electrical short). With 1 mm interdigitization and 10% shorting width (i.e., $\delta$=100 $\mu$) the light requirement is also around 10 $\mu J/cm^2$. This also corresponds to a 0.1 W average laser power per 100 $cm^2$ device.

The light source used to activate the LCT may be any type of optical source that can produce optical pulses at the correct energy level and having the correct wavelength and pulse duration. One such type of light source is the diode-laser pumped $Nd^{3+}$ solid state laser. $Nd^{3+}$ lasers, such as those based on the use of YAG, YLF and $YVO_4$ crystalline hosts, show significant wavelength match to the absorption band edge of silicon for effective optical absorption throughout the LCT. These lasers also demonstrate high efficiency and power multiplication available with Q-switching. Furthermore, the $Nd^{3+}$ solid state laser may be operated in both Q-switching and CW modes, thus allowing the integration of the low-level CW illumination for dV/dt protection and pulsed operation for switch-on and switch-off in a single laser device, as used in the embodiment illustrated in FIG. 4B.

It will be appreciated that different types of laser source may be used for controlling on or off operations of the LCT, such as laser diodes.

Figure 5A:
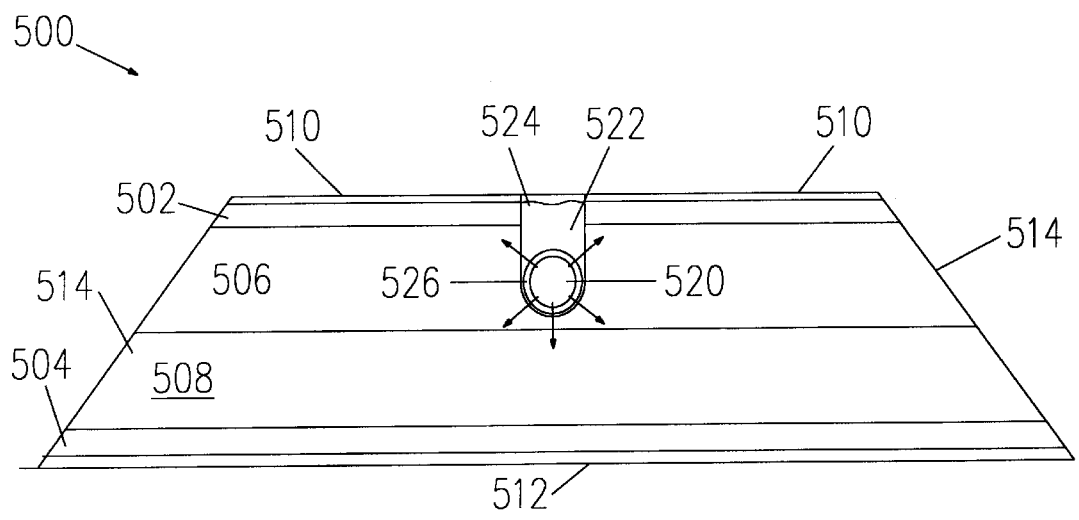
FIGS. 5A and 5B illustrate different embodiments of optical fiber illumination for the light controlled thyristor.

One particular approach to introducing light into the LCT is illustrated in FIG. 5A. The LCT 500 illustrated is provided with optical activation for switch-on only. The LCT 500 has four semiconductor layers, emitter and anode layers 502 and 504, and the base and drift layers 506 and 508. Upper and lower electrodes 510 and 512 are provided for electrical contact with an external circuit. The LCT may be provided with sloped edges 514 to increase voltage holding capacity.

An optical fiber 520 is positioned within a groove 522 that cuts through the upper electrode 510, the emitter layer 502 and partially into the base layer 506. The fiber 520 is held in place within the groove with an electrically isolating, optically transmissive material 524. The input of the fiber 520 is connected to a light source for activating the LCT 500. The portion of the fiber 520 that is within the groove transmits light transversely to illuminate the sides and bottom of the groove 522. The fiber 520 may be treated in a number of ways to obtain a transverse output. In this particular embodiment, the fiber 520 has an outer, transverse coupling layer 526 to couple light transversely from the fiber core. The fiber may be treated to produce a transverse output using other approaches, for example changing doping levels in the fiber core or cladding, or roughening the surface of the fiber core. The light thus coupled out of the fiber is transmitted into the semiconducting material of the LCT (shown with arrows). The fiber 520 may also be treated so that the direction of the transverse output light is controlled. For example, the fiber may be treated to transversely output light only sideways and downwards, into the semiconducting material, to avoid outputting light in an upwards direction which it is not absorbed and is thus wasted.

One particular method of forming the groove 522 is to use a high speed diamond saw. Tests have shown that of up to 300 μm depth and approximately 250 μm width may be cut into a silicon wafer. A four and one half inch diamond saw blade was used, consisting of diamond particles embedded in a plastic resin binder. The saw was operated at 14,000 rpm in the presence of water. It was found that a relatively soft coating on the upper surface of the silicon wafer, such as the gold upper electrode layer 510, reduces chipping at the edge of the groove when being formed with the diamond saw, although it will be appreciated that other methods may be used to reduce chipping, such as the use of a cover plate.

It will be appreciated that other methods of forming the groove 522 may be used, such as saw cutting, sand-blasting and using a directional etch.

Additional processes may be used after formation of the groove, such as smoothing the sidewalls after saw-cutting, for example using an etching process. In addition, the sidewalls of the groove 522 may be contoured to increase voltage holding capabilities. The sidewalls may also be passivated, for example by a high temperature steam oxidation process, to provide electrical insulation, to sequester impurities at the surface and to remove or blanket any subsurface damage introduced during the grooving process. A further passivation method is to use a polyamide passivation process, for example where a second layer is applied after the first layer has been cured at high temperature (250° C.).

An optical fiber with a step index profile has a core having a relatively high refractive index and a cladding with a relatively low refractive index. One method of transversely extracting light from such an optical fiber is to surround the core with a material having a higher refractive index than the fiber's cladding layer. For effective extraction for input into a silicon I,CT, it is preferable that the refractive index of the extracting material lie between the refractive index of the silica glass fiber core (n=1.46) and the refractive index of silicon (n=3.5).

In one approach to forming a high refractive index extraction layer 526, material having a high refractive index was introduced to a "sol-gel", and the "sol-gel" then applied to the outer surface of the fiber at those portions of the fiber where it was desired that light be extracted. The "sol-gel" was a suspension of partially condensed silicic acid molecules in the form of complexes of diameter 1–200 nm. The complexes are suspended in a weakly basic, aqueous medium with ammonium as the counter ion. On heating, ammonia and water are released as the condensation process is completed, leading to the production of silica. If, during the condensation process, particles of another phase are present, these particles are trapped in the silica matrix forming a hard, thermally-resistant composite. The use of admixtures of silica particles and silica sol-gel for the formation of high temperature protective coatings has been explored previously in U.S. Pat. No. 5,296,288, incorporated herein by reference.

It is an important feature of any material to be used for transverse extraction of light form a fiber is that the material is compatible with the core material, and with the semiconductor material used in the LCT. In the examples described herein, the core material is silica glass and the LCT is silicon-based.

The material used for transverse extraction was silicon nitride, which is available in the form of agglomerated submicron particles. After storage in air, these particles are covered with a thin oxide layer, of relatively low pH, suitable for suspension in the amorphous silica formed by the thermal condensation of the silica gel. The resulting fine particle composite appears largely homogeneous to light having a wavelength of more than about one micron. By bonding particles of silicon nitride to the fiber, to each other, and to the silicon surface by the silica formed in situ by the thermal condensation of the silica gel, a straightforward application procedure is permitted that uses materials known to be compatible with silicon and amenable to thermal treatment.

An example of the process used to coat the fiber with a transverse-extraction layer is as follows. 3.3 grams of Bayer $Si_3N_4$ powder [Baysinid VP PK 9120 (Grade ST) (Lot SN 97 C 17)] was completely dispersed in 55.6 grams of distilled water in a Pyrex bottle using an ultrasonic horn. This step was required since the as-received powder was severely agglomerated in large hard clumps. High purity $Si_3N_4$, having an off-white color was used. Lower grades of $Si_3N_4$ may be gray in color due to high concentrations of iron impurities and are not as useful for this application.

0.3 grams of Ludox AS-40 solution (40 wt. % colloidal $SiO_2$ particles in basic aqueous solution) was added to 5.0 grams of the mixture prepared in Step 1 and stirred until homogeneous in a PTFE cup.

The polymer sheath of the fiber was burned off from the ends and a small section in the middle of the optical fiber [SpecTran (HCN-M0200T) or Newport (F-MBB)] which was held horizontally in place by two small clamps. A small amount of the mixture in the PTFE cup was deposited in a disposable polyethylene pipette. Pressure was applied to the bulb so that a small droplet of the mixture was always present on the tip of the pipette. The droplet was moved along the bare optical fiber, back and forth, to wet the surface and coat the fiber with a very thin layer of the mixture. Care was taken to avoid the application of too thick a layer of the mixture, which would have resulted in significant absorption in the extraction layer.

The coating dried quickly in air onto the surface of the fiber. The propane torch was used again (far from the fiber)

to make sure the coating was dry and then much closer for a short time, back and forth, across the coated area until white hot, and then allowed to cool.

X-ray diffraction tests of the coating material deposited on a glass slide revealed diffraction lines only from the a- and b-polymorphs of silicon nitride. The silica derived from the sol gel was amorphous.

After the fiber cooled, the transverse extraction of the fiber was tested using a helium-neon laser. At least 80% of the light carried by the fiber (at 1.06 $\mu$m) could be removed radially. However, the absorption of light by the film becomes qualitatively noticeable when more than a single coating silica coating is used. The extraction, as measured in % per unit length, was not graded.

The fiber 520 may be held in place within the groove 522 with an electrically insulating, optically transmissive material, such as polyamide (n=1.8) or silica gel described above. Tests show that condensation of the Ludox sol-gel is largely complete at 600° C. Significant in-diffusion of gold from the electrodes into the silicon LCT may take place at such an elevated temperature. Therefore, where the sol-gel approach to fiber in-groove placement is used in a device having gold electrodes, the condensation is preferably performed prior to the deposition of gold electrodes. The polyamide may be cured at a temperature of 250° C., at which there is no significant in-diffusion of the gold electrode.

Figure 5B:
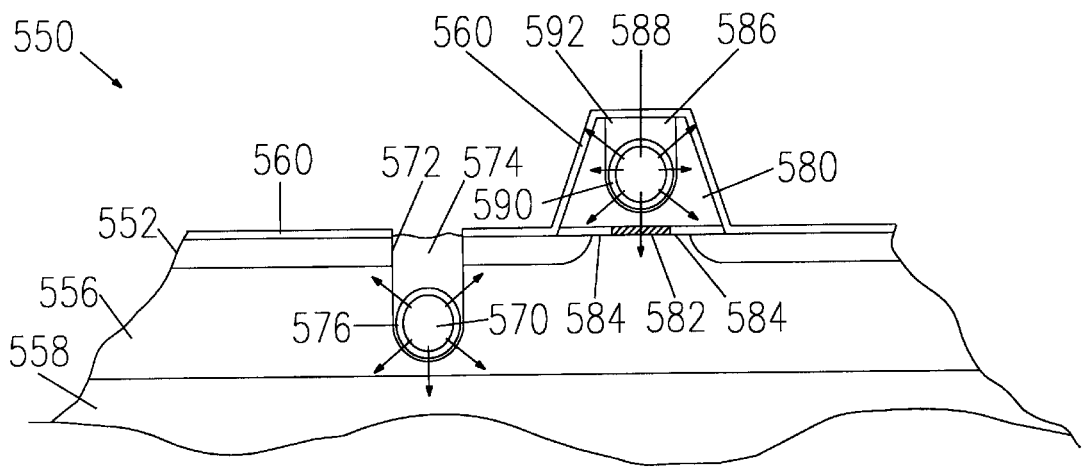

A portion of an active on/off LCT, that uses optical fibers for both on and off optical pulses is illustrated in FIG. 5B. The portion of the LCT 550 illustrated has an emitter layer 552, and base and drift layers 556 and 558. The device also has an upper electrode 560 attached to the emitter layer 552. The base layer 556 has a groove 572 containing a fiber 570 with and extraction coating 576 to transversely extract light from the fiber 570 to illuminate the semiconductor layers of the LCT 550 for switching the LCT 550 on.

The portion of the on/off LCT 550 illustrated also has a shorting region 580 similar to that illustrated in FIG. 1A. The shorting region 580 is positioned along the top surface of the LCT 550 and is electrically connected to the base layer 556 by an optically opaque, electrically conducting layer 582. An electrically insulating, optically opaque layer 584 lies between the shorting region 580 and the emitter layer 552. The electrically insulating, optically opaque layer insulates the electrically conducting layer 582 from the emitter layer 552 and the upper electrode 560. The upper electrode 560 connects the shorting region 580 and the emitter layer 552.

The shorting region 580 has a groove 586, in which is positioned the off-switching fiber 588. The off-switching fiber 588 has a transverse extraction layer 590. The fiber 588 is held within the groove 586 using an optically transmitting material 592, in a manner similar to that described above with regard to the on-switching fibers 520 and 570. The off-switching fiber 588 receives light from the light source which is transmitted through the transverse extraction layer 590 to illuminate the walls of the groove 586, thus creating carrier pairs in the shorting region 580. The carriers produced in the shorting region 580 create an electrical short for switching the LCT 550 off, and for providing dV/dt event protection.

Another embodiment of an LCT provides on/off optical control. Unlike the embodiment described, this other embodiment does not employ a shorting region. In this particular embodiment, the injecting junctions, between the emitter and base layers and between the anode and drift layers, have a sufficiently low injection efficiency that the thyristor is not able to sustain current by self-injection alone. Injection efficiency can be controlled by adjusting the carrier recombination time. Light illuminates the thyristor to create sufficient additional carriers to overcome the deficiency in carrier injection, so that the low injection efficiency LCT can conduct. Conduction within the low injection efficiency LCT lasts only for as long as the illumination provides sufficient additional carriers. When the level of illumination drops to a point where there are no longer sufficient additional carriers being generated through photo-absorption, conduction through the LCT terminates. The time taken for the current to collapse is primarily dependent on the carrier recombination time. Therefore, the operation of this LCT is actively controlled by the optical illumination, switching the LCT on when the illumination commences, and switching the LCT off when the illumination ceases. It will be appreciated that illumination of this embodiment of LCT may be performed using any of the illumination techniques discussed herein.

While various examples were provided above, the present invention is not limited to the specifics of the examples. For example, although the LCT has been discussed as being a silicon-based device, it may also be based on other semiconductor materials. Additionally, although the LCT has been described with a certain polarity of doping, e.g. having an n+ doped emitter layer and a p– doped baser layer, it will be appreciated that an LCT may be fabricated with regions having the opposite doping type from that illustrated e.g. having a p+ emitter layer and an n-base layer.

It will be appreciated that the selection of laser for use in such a system is dependent on the wavelength required for operation close to the absorption band edge of the particular semiconductor material employed in the LCT. It will also be appreciated that, since the LCT uses a fiber optic channel for controlling on and off operations, the trigger channel is essentially electrically floating, and so several LCT devices may be used in series for switching very high voltage without incurring problems of having to float gate control circuits.

In operation, a number of LCT performance parameters require to be traded-off against each another. For example, off speed is a function of carrier lifetime and device thickness, which in turn translates to device voltage and load impedance. Thus, a reduction in the carrier recombination time in the LCT may result in faster switch off, but may also result in higher on-impedance. Additionally, there are trade-offs in the amount of light injected into the LCT and the operating impedance: more light reduces the impedance by creating more carriers, but requires a larger light source which is more expensive. These, and related issues, are regarded as being engineering design issues for particular applications and do not affect the scope of the invention as claimed.

As noted above, the present invention is applicable to active high power switching applications, and is believed to be particularly useful in power switching in electrical utilities. However, it is expected that the LCT has widespread application in other areas, such as switching power supplies, electronic motor control actuators for aircraft stability and control surfaces, infinite ratio transmission systems in vehicles and ships, and radar modulators. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification, The claims are intended to cover such modifications and devices.

We claim:

1. An optically activatable semiconductor switch, comprising:
   a four layer thyristor structure, having respective first, second, third and fourth semiconductor layers, the first and third semiconductor layers having a first doping type, and the second and fourth semiconductor layers having a second doping type different from the first doping type;
   a first shorting structure formed from a semiconductor material of opposite doping from the first semiconductor layer, electrically coupled to the second semiconductor layer by a first electrically conducting, optically opaque layer;
   a first electrode layer over the first semiconductor layer and the first shorting structure, the first electrode layer being adapted to transmit light into the first shorting structure; and
   a first electrically insulating, optically opaque layer insulating the first electrically conducting, optically opaque layer from the first semiconductor layer and the first electrode layer.

2. A semiconductor switch as recited in claim 1, wherein the first shorting structure is bonded to the first electrically conducting, optically opaque layer, as an appendix to the four layer thyristor structure.

3. A semiconductor switch as recited in claim 1, wherein the first electrode layer is adapted to permit transmission of light into the thyristor structure.

4. A semiconductor switch as recited in claim 1, further comprising
   a second shorting structure formed from a semiconductor material of opposite doping type from the fourth semiconductor layer, electrically coupled to the third semiconductor layer by a second electrically conducting, optically opaque layer,
   a second electrode layer over the second shorting structure and the fourth semiconductor layer, the second electrode layer being adapted to transmit light into the second shorting structure, and
   a second electrically insulating, optically opaque layer insulating the second electrically conducting, optically opaque layer from the fourth semiconductor layer and the second electrode layer.

5. A semiconductor switch as recited in claim 4, wherein the first electrode layer and the second electrode layer are each adapted to permit transmission of light into the thyristor structure.

6. A semiconductor switch as recited in claim 1, wherein the first electrode layer has an aperture over the thyristor structure, and further comprising an optical fiber positioned relative to the aperture to illuminate the thyristor structure.

7. A semiconductor switch as recited in claim 6, wherein the optical fiber is disposed at least partially within the second semicondutor layer.

8. A semiconductor switch as recited in claim 6, wherein the first optical fiber is disposed within a recess extending through the first semiconductor layer and into the second semiconductor layer.

9. A semiconductor switch as recited in claim 1, wherein the first electrode layer has an aperture over the first shorting structure, and further comprising an optical fiber disposed relative to the aperture to illuminate the shorting structure.

10. A semiconductor switch as recited in claim 9, wherein the optical fiber is disposed at least partially within the first shorting structure.

11. A method of controlling a thyristor, comprising:
    illuminating a shorting structure, electrically connected between a thyristor emitter layer and one of a thyristor base layer and a thyristor drift layer, with light absorbed by the shorting structure, so as to close the shorting switch between the thyristor emitter layer and the one of the thyristor base layer and the thyristor drift layer.

12. A method as recited in claim 11, further comprising illuminating the thyristor base layer and a thyristor drift layer with light to generate a current between the thyristor base layer and the thyristor drift layer.

13. A method as recited in claim 11, further comprising illuminating the shorting structure with light absorbed by the shorting structure when a voltage applied across the thyristor is increasing.

14. A method as recited in claim 11, further comprising illuminating the shorting structure with light absorbed by the shorting structure when a current is passing between the thyristor base layer and the thyristor drift layer.

15. An optically activated switch system, comprising:
    a semiconductor switch including:
       a four layer thyristor structure, having respective first, second, third and fourth semiconductor layers, the first and third semiconductor layers having a first doping type, and the second and fourth semiconductor layers having a second doping type different from the first doping type,
       a shorting structure formed from a semiconductor material of opposite doping from the first semiconductor layer, electrically coupled to the second semiconductor layer by an electrically conducting, optically opaque layer,
       a first electrode layer over the first semiconductor layer and the first shorting structure, the first electrode layer being adapted to transmit light into the first shorting structure, and
       an electrically insulating, optically opaque layer insulating the electrically conducting, optically opaque layer from the first semiconductor layer and the first electrode layer;
    a light source;
    a controller coupled to the light source to control operation of the light source; and
    an optical transmission channel coupled between the light source and the semiconductor switch.

16. A system as recited in claim 15, wherein the optical transmission channel comprises an optical fiber coupled between the light source semiconductor switch.

17. A system as recited in claim 15, wherein the light source includes first and second lasers and the optical transmission channel includes a first optical path coupled between the first laser and the thyristor structure and also includes a second optical path coupled between the second laser and the shorting structure.

18. A system as recited in claim 15, wherein the light source includes a laser having an output coupled to an optical switch and the optical switch has an input to receive light from the laser and has first and second outputs, the optical switch coupled to the controller to select between the first and second outputs, and the optical transmission channel includes a first optical path coupled between the first optical switch output and the thyristor structure and a second optical path coupled between the second optical switch output and the shorting structure.

19. A system as recited in claim 15, wherein the controller is adapted to control the light source to provide one of a low level output to the shorting structure, a high level output to the thyristor structure and a high level output to the shorting structure at any one time.

20. An optically activatable semiconductor switch, comprising:
   a four layer thyristor structure, having respective first, second, third and fourth semiconductor layers, the first and third semiconductor layers having a first doping type, and the second and fourth semiconductor layers having a second doping type different from the first doping type;
   a first light activated semiconductor shorting switch, electrically coupled between the first and second layers;
   wherein light activation of the first light activated semiconductor shorting switch when the thyristor conducts a thyristor current results in an electrical short between the first and second layers, terminating the thyristor current.

21. A semiconductor switch as recited in claim 20, further comprising a second light activated semiconductor shorting switch, electrically coupled between the third and fourth layers, wherein light activation of at least one of the first and second light activated semiconductor shorting switches when the thyristor conducts a thyristor current results in an electrical short between the first and second layers and between the third and fourth layers respectively, terminating the thyristor current.

22. A semiconductor switch as recited in claim 20, further comprising a first light source coupled to activate the first light activated semiconductor shorting switch.

23. A semiconductor switch as recited in claim 22, further comprising an optical fiber disposed between the first light source and the first light activated semiconductor shorting switch.

24. A semiconductor switch as recited in claim 20 further comprising a second light source coupled to illuminate at least one of the second and third semiconductor layers so as to initiate the thyristor current when a voltage is applied across the first and fourth semiconductor layers.

25. A semiconductor switch as recited in claim 24, further comprising an optical fiber disposed between the second light source and at least one of the second and third semiconductor layers to direct light from the second light source to the second semiconductor layer.

26. A semiconductor switch as recited in claim 25, wherein the optical fiber is disposed within a recess extending either through the first semiconductor layer into the second semiconductor layer or through the fourth semiconductor layer into the third semiconductor layer.

27. A semiconductor switch as recited in claim 20, further comprising:
   a light source;
   a controller coupled to the light source to control operation of the light source; and
   an optical transmission channel coupled between the light source and the first light activated semiconductor shorting switch.

28. A method of controlling a thyristor having first and second semiconductor layers forming a first semiconductor junction, the second semiconductor layer and a third semiconductor layer forming a second semiconductor junction and the third semiconductor layer and a fourth semiconductor layer forming a third semiconductor junction, the method comprising:
   illuminating a first semiconductor shorting switch, connected between the first and second semiconductor layers, with a light absorbed by the first semiconductor shorting switch, so as to reduce electrical resistance of the first semiconductor shorting switch and terminate a current flowing through the first semiconductor junction.

29. A method as recited in claim 28, further comprising illuminating at least one of the second and third semiconductor layers with light to generate a current between the thyristor base layer and the thyristor drift layer, before illuminating the first semiconductor shorting switch.

30. A method as recited in claim 28, further comprising illuminating the first semiconductor shorting switch with light absorbed by the shorting switch when a voltage applied across the first and fourth semiconductor layers is increasing.

31. A method as recited in claim 28, further comprising illuminating the first semiconductor shorting switch when a current is passing between the second and third semiconductor layers.

32. A method as recited in claim 28, further comprising illuminating a second semiconductor shorting switch, connected between the third and fourth semiconductor layers, with light absorbed by the second semiconductor shorting switch, so as to reduce electrical resistance of the second semiconductor shorting switch and terminate a current flowing through the third semiconductor junction.

* * * * *